(12) United States Patent
Fuin et al.

(10) Patent No.: US 6,564,303 B1
(45) Date of Patent: May 13, 2003

(54) DUAL PORT MEMORY FOR DIGITAL SIGNAL PROCESSOR

(75) Inventors: Didier Fuin, Lumbin (FR); Joël Curtet, Fontaine (FR); Fabrice Devaux, Uriage (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/217,370

(22) Filed: Dec. 21, 1998

(30) Foreign Application Priority Data

Dec. 31, 1997 (FR) ............................................ 97 16869

(51) Int. Cl.$^7$ .............................................. G06F 12/00
(52) U.S. Cl. ........................ 711/149; 711/150; 711/148; 712/35; 712/215
(58) Field of Search ................................ 712/35, 24, 4, 712/9, 206, 212, 215, 2, 7, 10, 14, 21, 23, 245, 246; 711/162, 5, 168, 147, 149, 150, 153, 155; 707/284; 714/6, 7, 11

(56) References Cited

U.S. PATENT DOCUMENTS

| 4,905,196 A | * | 2/1990 | Kirrmann ..................... 365/200 |
| 5,175,839 A | | 12/1992 | Ikeda et al. .................. 711/200 |
| 5,487,024 A | | 1/1996 | Girardeau, Jr. ............. 708/606 |
| 5,638,533 A | | 6/1997 | Law ............................ 711/157 |
| 5,659,695 A | * | 8/1997 | Kelley et al. ................... 711/5 |
| 5,745,672 A | * | 4/1998 | Stiffler ........................ 711/162 |
| 5,774,737 A | * | 6/1998 | Nakano ........................ 712/24 |
| 5,870,537 A | * | 2/1999 | Kern et al. .................. 711/162 |
| 5,884,092 A | * | 3/1999 | Kiuchi et al. ................. 712/35 |
| 5,890,003 A | * | 3/1999 | Cutts, Jr. et al. ........... 710/263 |
| 5,958,038 A | * | 9/1999 | Agrawal et al. .............. 712/36 |
| 5,966,143 A | * | 10/1999 | Breternitz, Jr. ............. 345/709 |
| 6,006,307 A | * | 12/1999 | Cherukuri .................... 711/114 |

FOREIGN PATENT DOCUMENTS

JP        57-152600    *   9/1982

OTHER PUBLICATIONS

French Search Report from French Patent Application 97 16869, filed Dec. 31, 1997.
Patent Abstracts of Japan, vol. 006, No. 258 (P–163), Dec. 17, 1982 & JP–A–57 152600 (Nippon Denki KK).
R.S. Capowski: "Dual Storage System" IBM Technical Disclosure Bulletin, vol. 27, No. 1A, Jun. 1984, p. 360, New York, US.

* cited by examiner

*Primary Examiner*—Hong Kim
(74) *Attorney, Agent, or Firm*—Wolf, Greenfield & Sacks, P.C.; James H. Morris

(57) ABSTRACT

The present invention relates to a data processing system comprising a processor provided with two memory access units operating in parallel; two separate memories respectively associated with the two access units; and circuitry for, when the address of a datum to be written into a memory is in a predetermined address range, writing the datum into both memories at the same time at the same address.

22 Claims, 2 Drawing Sheets

DUAL PORT MEMORY FOR DIGITAL SIGNAL PROCESSOR

BACKGROUND OF THE INVENTION

1. Field of the Invention

The present invention relates to a digital signal processor (DSP), and more specifically to a memory organization particularly well adapted to a DSP.

2. Discussion of the Related Art

FIG. 1 schematically and partially shows a conventional DSP architecture. The DSP includes four processing units operating in parallel. Two of these units are memory access units 10. An arithmetic unit 12 and a branch management unit 14 are further provided. Each of memory access units 10 is associated with an independent memory bus X or Y. A program memory 16 contains compound instructions INST, each compound instruction being actually formed of four simple instructions (INST1–INST4) provided at the same time to the respective units 10, 12, and 14. Of course, the four units are often not used at the same time. Then, the compound instruction provided by memory 16 includes NOPs corresponding to the unused units.

A DSP of the type of FIG. 1 is optimized to perform vector operations of the type x[i] OP y[j], where i and j vary, generally in a loop, and where OP designates any operation to be performed by arithmetic unit 12. Indeed, operands x[i] and y[i] can be fetched together via, respectively, bus X and bus Y and processed in the same cycle by arithmetic unit 12.

For this type of operation, values x[i] and values y[i] can be respectively stored in two independent memories respectively connected to buses X and Y.

However, a DSP may also need to perform operations of the type z[i] OP z[j], the values of z being all stored in a same memory. In this case, a value z, according to the unit 10 which receives the corresponding read instruction, may be fetched at one time by bus X, at another time by bus Y, or even by both buses at the same time. Thus, access should be possible to a same value z over both buses X and Y.

Theoretically, a dual port memory connected to buses X and Y may be used for this purpose. However, dual port memories are particularly costly in terms of surface.

FIG. 2 illustrates a memory organization which is preferred given the fact that the number of values submitted to operations of the type z[i] OP z[j] is relatively low. This organization includes a dual port memory 18, the size of which is sufficient to contain "z"-type values, that is, the values which have to be accessible over both buses X and Y. Two single port memories 20 and 22 are respectively associated to "x"-type values and to "y"-type values, the "x"-type values being those which are only accessible over bus X and the "y"-type values being those only accessible over bus Y.

The first address bus of dual port memory 18 and the address bus of single port memory 20 are connected to address bus XA of memory bus X. Similarly, the second address bus of dual port memory 18 and the address bus of single port memory 22 are connected to address bus YA of memory bus Y. The first data bus of memory 18 and the data bus of memory 20 are routed to data bus XD of memory bus X via a multiplexer/demultiplexer 24. Similarly, the second data bus of memory 18 and the data bus of memory 22 are routed towards data bus YD of memory bus Y by a multiplexer/demultiplexer 26.

A decoder 28 controls multiplexers/demultiplexers 24 and 26 according to the addresses presented over buses XA and YA. In particular, when the address present on bus XA is in a specific range, decoder 28 controls multiplexer/demultiplexer 24 to route bus XD to memory 18. Outside the specific range, decoder 28 routes bus XD to memory 20. The same mechanism is used to control multiplexer/demultiplexer 26 according to the address present on bus YA.

Despite the complexity of multiplexers/demultiplexers 24 and 26, the surface occupied by this memory organization is generally smaller than that occupied by a single dual port memory gathering memories 18, 20, and 22, this given the fact that the capacity of dual port memory 18 is relatively low.

Multiplexers/demultiplexers 24 and 26 considerably increase the latency times of the read and write operations in the memories.

SUMMARY OF THE INVENTION

An object of the present invention is to provide a memory organization adapted to a digital signal processor enabling access to a same datum by two distinct channels while occupying a particularly small surface and not affecting the latency times of access to the data.

This and other objects are achieved by means of a data processing system comprising a processor provided with two memory access units operating in parallel; two separate memories respectively associated with the two access units; and means for, when the address of a datum to be written into a memory is in a predetermined address range, writing the datum into both memories at the same time at the same address.

According to an embodiment of the present invention, said means comprise two identical write instructions provided at the same time to the two access units.

According to an embodiment of the present invention, said means comprise a first multiplexer connected to copy, in a first access unit a write instruction provided to the second access unit when the write address is in the predetermined range.

According to an embodiment of the present invention, said means comprise a second multiplexer connected to copy into the second access unit a write instruction provided to the first access unit when the write address is in the predetermined range.

The foregoing objects, features and advantages of the present invention will be discussed in detail in the following non-limiting description of specific embodiments in connection with the accompanying drawings.

DETAILED DESCRIPTION

Figure 1:
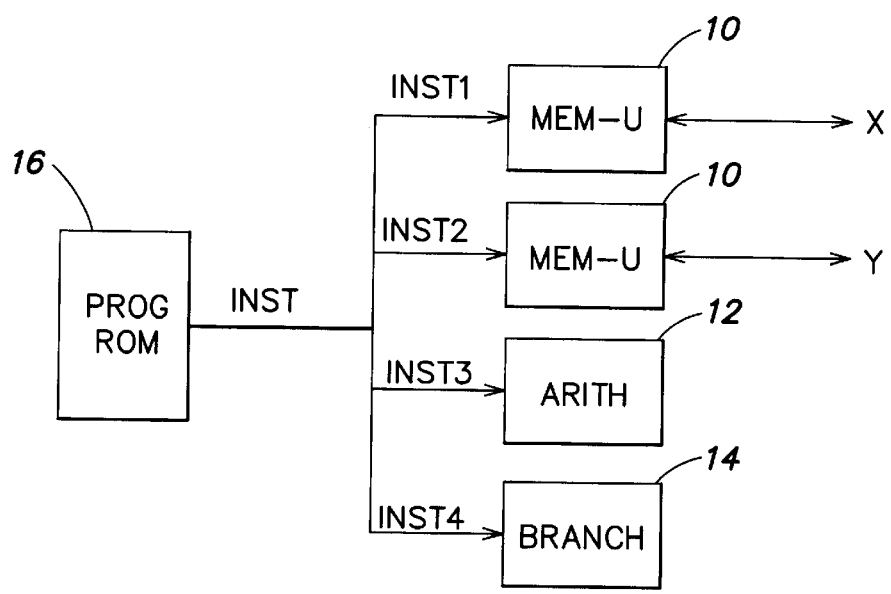
FIG. 1, previously described, schematically and partially shows a conventional DSP memory architecture.
Figure 2:
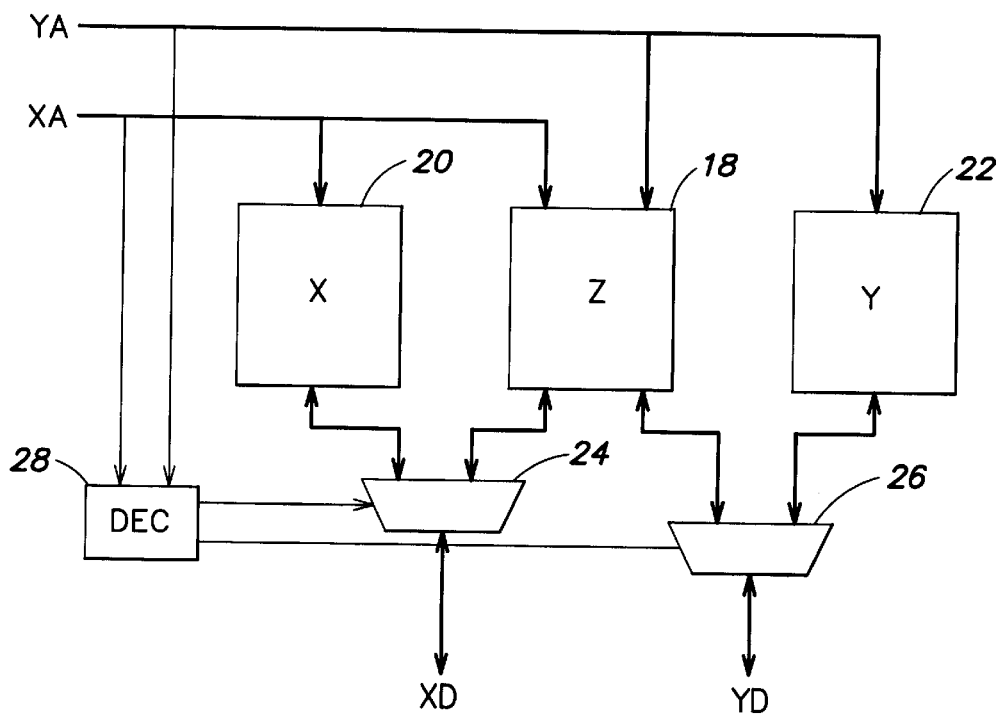
FIG. 2 schematically shows a conventional organization adapted to a DSP of the type of FIG. 1.
Figure 3:
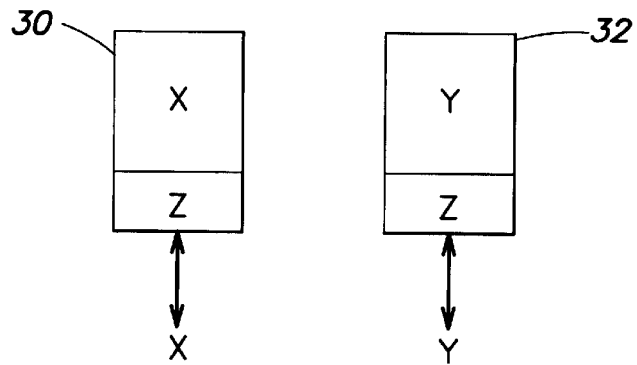
FIG. 3 schematically shows a memory organization according to the present invention.

In FIG. 3, a memory organization for a DSP of the type in FIG. 2 comprises two single port memories 30 and 32 only. Memories 30 and 32 are respectively connected to buses X and Y of the DSP of FIG. 1. Memory 30 comprises an area X for storing "x"-type values, while memory 32 comprises an area Y for storing "y"-type values. The two areas correspond to memories 20 and 22 of the conventional organization of FIG. 2. It should be reminded that the "x" or "y"-type values are those to which access is always had over the same bus X or Y.

According to the present invention, each of memories 30 and 32 is increased by a respective area Z of same size for containing the "z"-type values, that is, the values which must be accessible either over bus X, or over bus Y. Areas Z of memories 30 and 32 are exact copies of each other and are accessible by a same address range, for example, the addresses used to access to memory 18 of FIG. 2. In other words, if access is had over bus X to a value in area Z of memory 30, access can be had to this same value at the same address in memory 32 over bus Y.

Of course, for such a memory organization to properly operate, it is necessary to ensure that each value written into area Z of memory 30 is also written at the same address in memory 32.

In a conventional memory organization of the type in FIG. 2, to write a value z into memory 18, it is enough to provide a write instruction to any of the access units 10 of the DSP of FIG. 1. By so operating with a memory organization of the type in FIG. 3, value z is written into a single one of memories 30 and 32, which is not desirable.

In order to avoid this, an advantageous solution comprises modifying the instructions of the DSP program to always provide to both access units 10 a same instruction of writing of a "z"-type value. This solution requires no hardware modification of the DSP or of the memory organization.

The surface occupied by the two redundant areas Z is comparable to the surface occupied by dual port memory 18 of FIG. 2. However, multiplexers/demultiplexers 24 and 26 and decoder 28 are omitted, which enables a significant surface saving and a decrease of the latency time of access to memories 30 and 32.

Figure 4:
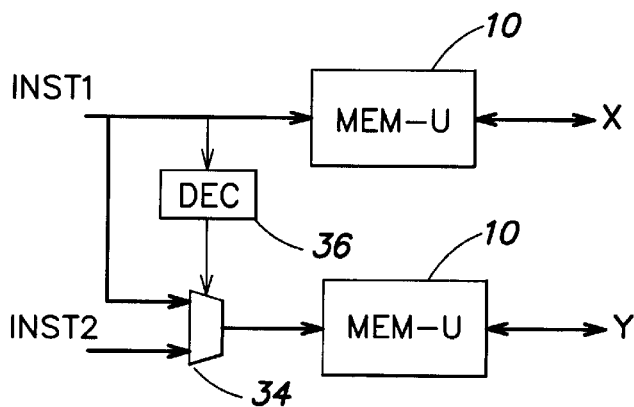
FIG. 4 illustrates a solution enabling to use the memory organization of FIG. 3, in a specific case where it is not desired to modify the program of a conventional DSP.

FIG. 4 illustrates a solution to write a "z"-type value into both memories 30 and 32 without modifying the DSP program. The instruction input of second memory access unit 10 is preceded by a multiplexer 34 that selects the instruction INST2 provided to this unit, or the instruction INST1 provided to the first unit 10. The position of multiplexer 34 is determined by a decoder 36 according to the address carried in the write mode by instruction INST1. If this address corresponds to a value z, multiplexer 34 is positioned to select instruction INST1. Otherwise, it is positioned to select instruction INST2.

This solution of course requires a modification of the DSP of FIG. 1. The surface occupied by multiplexer 34 and decoder 36 is, however, relatively low. Further, this solution assumes that the write instructions of values z always arrive over bus INST1.

Figure 5:
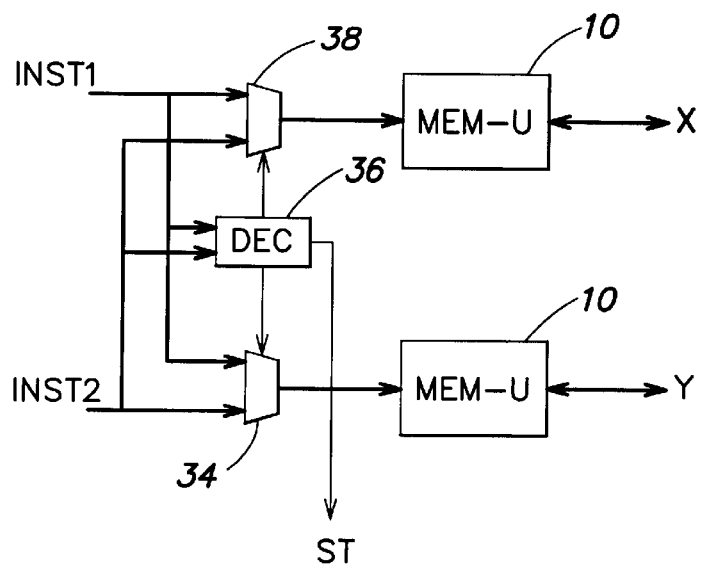
FIG. 5 illustrates an alternative to the solution of FIG. 4.

FIG. 5 illustrates an alternative to the solution of FIG. 4, by means of which the programmer no longer has to take account of the position of a write instruction for a "z"-type value. An additional multiplexer 38, also controlled by decoder 36, precedes the instruction input of the first memory access unit 10 to select one or the other of the two instructions INST1 and INST2. When one or the other of instructions INST1 and INST2 is a write instruction for a value z, decoder 36 detects it and positions multiplexers 34 and 38 to duplicate this instruction on both memory access units 10.

A problem arises when a write instruction for a "z"-type value and another memory access instruction arrive at the same time. It is not possible to have them executed at the same time by both units 10. The DSP programmer or the compiler could make sure that both accesses are assigned to distinct cycles.

The embodiment of FIG. 5, however, frees the programmer or the compiler from this constraint. For this purpose, decoder 36 is provided to detect the presence over buses INST1 and INST2 of two simultaneous memory accesses, one of which is a writing of a value z. Decoder 36 then activates a signal ST indicating a latency of one cycle, and performs two successive positionings of multiplexers 34 and 38. In the first position, for example, the multiplexers transmit, to units 10, two copies of the write instruction of value z. In the next position, the multiplexers transmit the other instruction of access to the corresponding unit 10. Preferably, the other unit 10 then receives a null statement (NOP), but this is difficult to implement without providing additional circuits. Actually, this other unit can receive again the write instruction of value z, which causes the writing twice in a row of the same value at the same memory location, that is, the state of the memory remains unchanged.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A data processing system comprising:

a processor capable of executing composite instructions for simultaneous access to two data words and provided for this purpose with two memory access units operating in parallel, each unit being controlled by a respective simple instruction contained in such a composite instruction;

two separate memories respectively coupled via separate memory buses to the two memory access units; and means for, when a simple write instruction for one of the memory access units contains a data word which should be read accessible by the other memory access unit, writing, via the separate memory buses, the data in both memories at the same time at the same address.

2. The system of claim 1, wherein said means comprises one composite write instruction having two identical simple instructions.

3. The system of claim 2, wherein said means comprises a first multiplexer connected to copy in said one of the memory access units a simple write instruction provided to said other memory access unit when the write address is in a predetermined range.

4. The system of claim 3, wherein said means comprises a second multiplexer connected to copy into said other memory access unit a simple write instruction provided to said one of the memory access units when the write address is in the predetermined range.

5. A data processing system comprising:

a processor capable of executing composite instructions for simultaneous access to two data words and provided for this purpose with two memory access units operating in parallel, each unit being controlled by a respective simple instruction contained in such a composite instruction;

two separate memories respectively associated with the two memory access units; and means for, when a simple write instruction for one of the memory access units contains a data word which should be read accessible by the other memory access unit, writing the data in both memories at the same time at the same address, wherein said means comprises one composite write instruction having two identical simple instructions, wherein said means comprises a first multiplexer connected to copy in said one of the memory access units a simple write instruction provided to said other memory access unit when the write address is in a predetermined range, wherein said means comprises a second multiplexer connected to copy into the said other second access unit a simple write instruction provided to the first access unit when the write address is in the predetermined range, wherein the multiplexers are controlled by an address decoder that analyzes the addresses of the simple write instructions contained in the composite write instructions and that is adapted, when a first of two data words to be written should be accessible by the two access units, signaling one memory latency cycle to the processor while it controls the multiplexers for, in two successive positioning, presenting the simple write instruction of the first data word to the two access units and presenting the simple write instruction of the other data word to the corresponding unit.

6. A data processing system comprising:
   a processor for executing composite instructions for simultaneous access to two data words, said processor including;
   two memory access units,
   said memory access units being connected parallel,
   each memory access unit being controlled by a respective simple instruction contained in such composite instruction,
   two separate memories respectively coupled via separate memory buses to said two memory access units;
   each of said memories including a main area and a secondary area; and
   a controller for, when a simple write instruction for one of the memory access units contains a data word which should be read accessible by the other memory access unit, writing, via the separate memory buses, the data in both secondary area memories at the same time and at the same address.

7. The system of claim 6, wherein said composite instruction comprises a composite write instruction having two identical simple instructions.

8. The system of claim 6, wherein said controller comprises a first multiplexer connected to copy in a said one of the memory access units a simple write instruction provided to said other memory access unit when the write address is in a predetermined range.

9. The system of claim 8, wherein said controller further comprises a decoder for controlling said first multiplexer by analyzing the addresses of the simple write instruction contained in composite write instruction.

10. The system of claim 9, wherein said controller further comprises a second multiplexer connected to copy into said other memory access unit a simple write instruction provided to said one of said memory access units when the write address is in the predetermined range.

11. The system of claim 10, wherein said multiplexers are controlled so that when a first of two data words to be written should be accessible by two access units, signaling one memory latency cycle to the processor while it controls the multiplexers for, in two successive positionings, presenting the simple write instruction of the first data word to the two access units and presenting the simple write instruction of the other data word to the corresponding unit.

12. A data processing system comprising:
   a processor for executing composite instructions for simultaneous access to two data words, said processor including;
   two memory access units,
   said memory access units being connected parallel,
   each memory access unit being controlled by a respective simple instruction contained in such composite instruction,
   a separate x bus;
   a separate y bus;
   two separate memories respectively associated with said two memory access units and respectively coupled to said x and y busses;
   said two memories including a first memory having an area x for storing x-type values,
   and a second memory having an area y for storing x-type values;
   said memories further each including a z area each of the same size and each for containing z-type values; and
   means for, when a simple write instruction for one of the memory access units contains a data word which should be read accessible by the other memory access unit, writing, via the separate x bus and the separate y bus, the data in both secondary z areas of the memories at the same time and at the same address.

13. The system of claim 12, wherein if the write instruction does not correspond to a value z then the write instruction is coupled to its corresponding x or y area.

14. The system of claim 12, wherein said means further comprises means responsive to an x or y write instruction for coupling such instruction to respective x and y areas of memories.

15. The system of claim 12, wherein said means comprises one composite write instruction having two identical simple instructions.

16. The system of claim 12, wherein said means comprises a first multiplexer connected to copy in said one of the memory access units a simple write instruction provided to said other memory access unit when the write address is in a predetermined range.

17. The system of claim 16, further including an address decoder that analyzes the addresses of the simple write instructions contained in the composite write instructions.

18. The system of claim 17, wherein said means further comprises a second multiplexer connected to copy into said other memory access unit a simple write instruction provided to the one said memory access unit when the write address is in the predetermined range.

19. The system of claim 18, wherein said multiplexer means are controlled so that when a first of two data words to be written should be accessible by two access units, signaling one memory latency cycle to the processor while it controls the multiplexers means for, in two successive positionings, presenting the simple write instruction of the first data word to the two access units and presenting the simple write instruction of the other data word to the corresponding unit.

20. The system of claim 12, wherein each of said memories is a single port memory.

21. The system of claim 12, wherein the areas z of the memories are copies of each other and are accessible by a same address range.

22. The system of claim 21, wherein, if access is had over bus x to a value in area z of the first memory, access can be had to the same value at the same address in the second memory over bus y.

* * * * *